US008125811B2

(12) United States Patent  (10) Patent No.: US 8,125,811 B2
Chiang  (45) Date of Patent: Feb. 28, 2012

(54) CONTENT-ADDRESSABLE MEMORY

(75) Inventor: Ming-Cheng Chiang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 251 days.

(21) Appl. No.: 12/561,539

(22) Filed: Sep. 17, 2009

(65) Prior Publication Data

US 2010/0067277 A1  Mar. 18, 2010

(30) Foreign Application Priority Data

Sep. 18, 2008 (TW) ................................ 97135791 A

(51) Int. Cl.
*G11C 15/04* (2006.01)
(52) U.S. Cl. ..................................... 365/49.17; 365/154
(58) Field of Classification Search ............... 365/49.17, 365/154, 156
See application file for complete search history.

(56) References Cited

U.S. PATENT DOCUMENTS

| 6,460,112 | B1 * | 10/2002 | Srinivasan et al. | ............ | 711/108 |
| 6,499,081 | B1 * | 12/2002 | Nataraj et al. | ................ | 711/108 |
| 6,597,596 | B2 * | 7/2003 | Gordon et al. | ............. | 365/49.16 |
| 7,571,371 | B2 * | 8/2009 | Wickeraad | ..................... | 714/763 |

* cited by examiner

*Primary Examiner* — Anh Phung
(74) *Attorney, Agent, or Firm* — The Webb Law Firm

(57) ABSTRACT

A CAM includes first and second memory units. The first memory unit includes: a first data memory cell for storing a first data bit; a first comparison circuit for comparing a first search bit with the first data bit to determine if there is a match, and outputting a first comparison result; and a first CMOS logic circuit for performing a logic operation on the first comparison result and outputting a first matching result. The second memory unit includes: a second data memory cell for storing a second data bit; a second comparison circuit for comparing a second search bit with the second data bit to determine if there is a match, and outputting a second comparison result; and a second static CMOS logic circuit for performing a logic operation on the first matching result and the second comparison result, and outputting an output matching result.

14 Claims, 12 Drawing Sheets

(a)

(b)

CONTENT-ADDRESSABLE MEMORY

CROSS-REFERENCE TO RELATED APPLICATION

This application claims priority to Taiwanese Application No. 097135791, filed on Sep. 18, 2008.

1. FIELD OF THE INVENTION

The present invention relates to a content-addressable memory (CAM), more particularly to a CAM that can save the step of precharging.

2. DESCRIPTION OF THE RELATED ART

A CAM comprises a plurality of CAM cells arranged in an array. Content stored in each row of the array is compared with search data to determine if there a match, and a plurality of matching bits corresponding respectively to the rows are generated in accordance with the results of such a comparison.

Depending on the number of states that can be stored by the CAM cells, a CAM is classified as a binary CAM or a ternary CAM.

In the case of the binary CAM, each CAM cell includes a data memory cell and a comparison circuit. The data memory cell stores a data bit and a complementary data bit to represent one of either a "0" or "1" state.

In the case of the ternary CAM, each CAM cell includes a data memory cell, a mask memory cell, and a comparison circuit. The data memory cell stores a data bit and a complementary data bit, and the mask memory cell stores a mask bit and a complementary mask bit. Each of the bits of the data memory cell and the mask memory cell may represent a "0," "1," or "don't care" state.

For both the binary CAM and the ternary CAM, precharging is required at each comparison cycle with respect to an input terminal of a search bit, an input terminal of a complementary search bit, and an output terminal of a matching bit. As a result, overall efficiency is reduced and power consumption is increased.

SUMMARY OF THE INVENTION

Therefore, an object of this invention is to provide a content-addressable memory (CAM) having a high operating speed and a low power consumption.

According to this invention, a CAM comprises a first memory unit and a second memory unit.

The first memory unit includes: a first data memory cell for storing a first data bit; a first comparison circuit coupled to the first data memory cell, and for comparing a first search bit with the first data bit to determine if there is a match, and outputting a first comparison result; and a first static complementary metal-oxide-semiconductor (CMOS) logic circuit coupled to the first comparison circuit, and for performing a logic operation on the first comparison result and outputting a first matching result.

The second memory unit includes: a second data memory cell for storing a second data bit; a second comparison circuit coupled to the second data memory cell, and for comparing a second search bit with the second data bit to determine if there is a/match, and outputting a second comparison result; and a second static CMOS logic circuit coupled to the first static CMOS logic circuit and the second comparison circuit, and for performing a logic operation on the first matching result and the second comparison result, and outputting an output matching result.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

A content-addressable memory (CAM) according to the present invention receives an n-number of search bits $SB_j$ and an n-number of complementary search bits $\overline{SB_j}$, and outputs an m-number of matching bits $MB_i$, where $i=1$–$m$ and $j=1$–$n$.

First Preferred Embodiment

Figure 1:
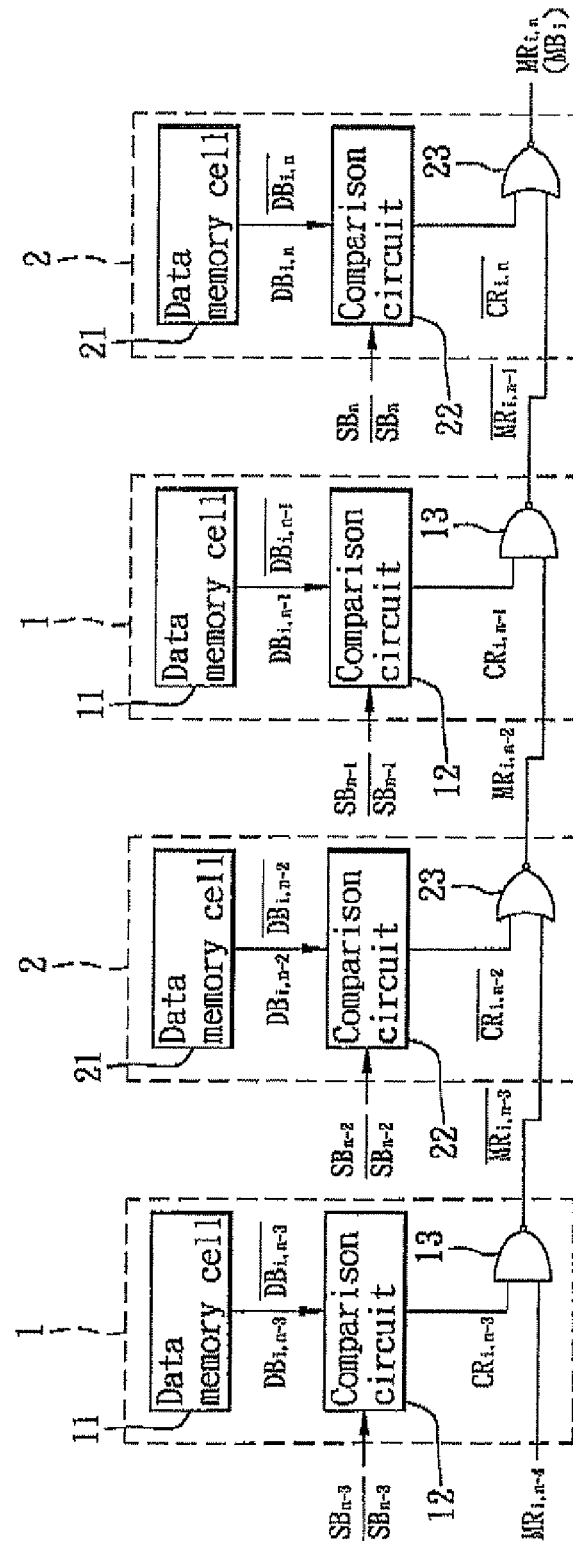
FIG. 1 is a simplified block diagram of the first preferred embodiment of a content-addressable memory according to the present invention.

Referring to FIG. 1, the first preferred embodiment of a CAM according to the present invention is a binary CAM, and includes a plurality of memory units 1 and a plurality of memory units 2 (in FIG. 1, only the last four memory units 1, 2 on an ith row are shown). For each row, the memory units 1 are alternatingly disposed with the memory units 2, and each memory unit 1, 2 receives one of the n-number of search bits $SB_j$ and one of the n-number of complementary search bits $\overline{SB_j}$.

Each memory unit 1 includes a data memory cell 11, a comparison circuit 12, and a static complementary metal-oxide-semiconductor (CMOS) logic circuit 13. The data memory cell 11 stores a data bit $DB_{i,j}$ and a complementary data bit $\overline{DB_{i,j}}$. The comparison circuit 12 is coupled to the data memory cell 11, receives the corresponding search bit $SB_j$, the corresponding complementary search bit $\overline{SB_j}$, and the data bit $DB_{i,j}$ and complementary data bit $\overline{DB_{i,j}}$ stored in the data memory cell 11, compares the corresponding search bit $SB_j$ and the corresponding complementary search bit $\overline{SB_j}$ with the data bit $DB_{i,j}$ and complementary data bit $\overline{DB_{i,j}}$ stored in the data memory cell 11 to determine if there is a match, and outputs a comparison result $CR_{i,j}$. The static CMOS logic circuit 13 is coupled to the comparison circuit 12 and a previous memory unit 2, receives the comparison result $CR_{i,j}$ output from the comparison circuit 12 and a matching result $MR_{i,j-1}$ output from the previous memory unit 2 so as to perform a logic operation thereon, and outputs a complementary matching result $\overline{MR_{i,j}}$ accordingly.

Each memory unit 2 includes a data memory cell 21, a comparison circuit 22, and a static CMOS logic circuit 23. The data memory cell 21 stores a data bit $DB_{i,j}$ and a complementary data bit $\overline{DB_{i,j}}$. The comparison circuit 22 is coupled to the data memory cell 21, receives the corresponding search bit $SB_j$, the corresponding complementary search bit $\overline{SB_{i,j}}$, and the data bit $DB_{i,j}$ and complementary data bit $\overline{DB_{i,j}}$ stored in the data memory cell 21, compares the corresponding search bit $SB_j$ and the corresponding complementary search bit $\overline{SB_j}$ with the data bit $DB_{i,j}$ and complementary data bit $\overline{DB_{i,j}}$ stored in the data memory cell 21 to determine if there is a match, and outputs a complementary comparison result $\overline{CR_{i,j}}$. The static CMOS logic circuit 23 is coupled to the comparison circuit 22 and a previous memory unit 1, receives the complementary comparison result $\overline{CR_{i,j}}$ output from the comparison circuit 22 and a complementary matching result $\overline{MR_{i,j-1}}$ output from the previous memory unit 1 so as to perform a logic operation thereon, and outputs a matching result $MR_{i,j}$ accordingly. The matching result $MR_{i,n}$ output from the last memory unit 2 in each row functions as the matching bit $MB_i$.

Figure 2:
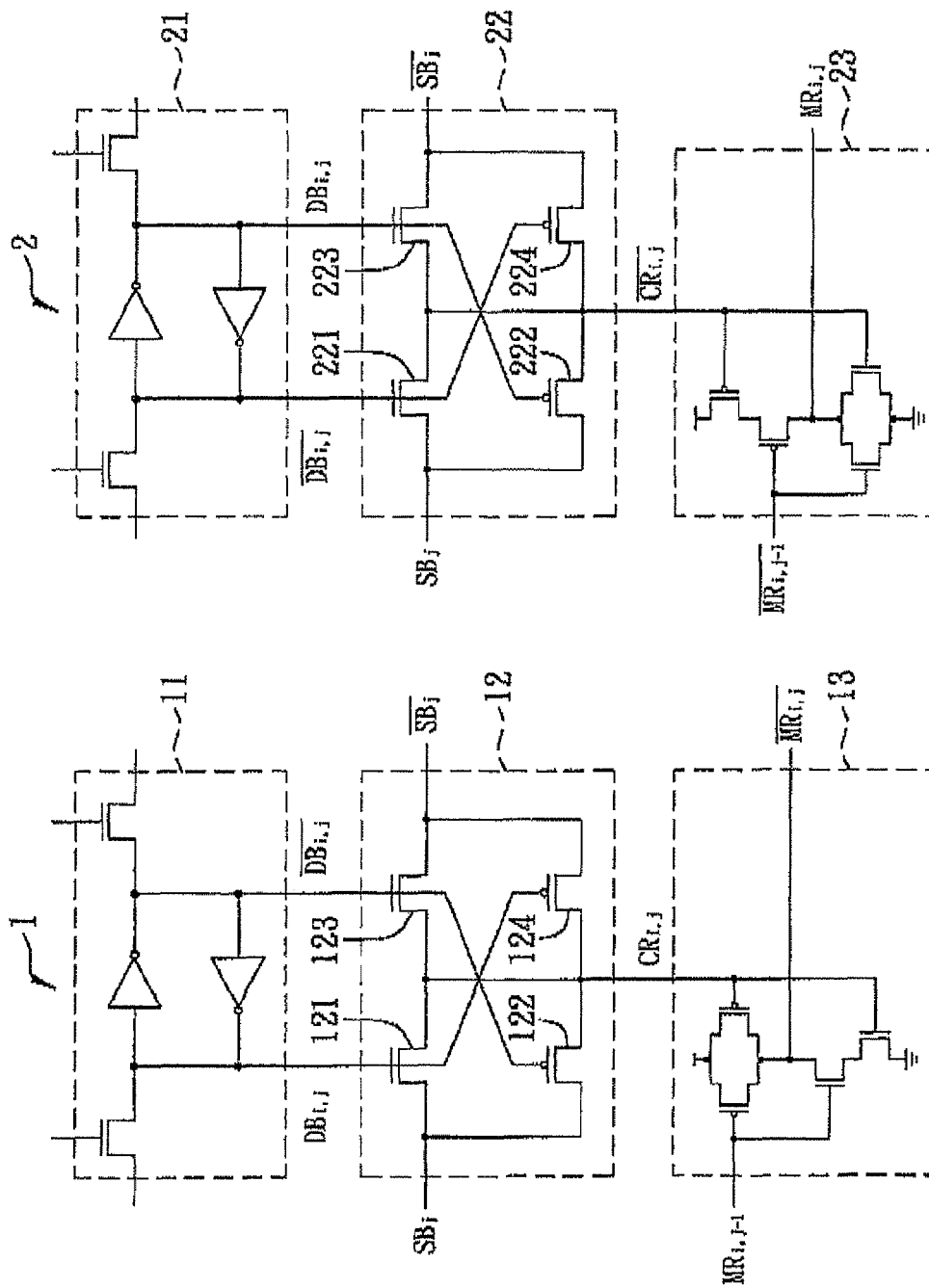
FIG. 2 is a schematic circuit diagram, illustrating memory units of the first preferred embodiment.

Referring to FIG. 2(a), for each memory unit 1, the data memory cell 11 is a static random access memory (SRAM) cell. The comparison circuit 12 includes two n-channel metal-oxide-semiconductor field-effect transistors (NMOS transistors) 121, 123 and two p-channel metal-oxide-semiconductor field-effect transistors (PMOS transistors) 122, 124. The NMOS transistor 121 and the PMOS transistor 122 are controlled by the data bit $DB_{i,j}$ and the complementary data bit $\overline{DB_{i,j}}$, respectively, and are connected in parallel between the input terminal of the corresponding search bit $SB_j$ and the output terminal of the comparison result $CR_{i,j}$. The NMOS transistor 123 and the PMOS transistor 124 are controlled by the complementary data bit $\overline{DB_{i,j}}$ and the data bit $DB_{i,j}$, respectively, and are connected in parallel between the input terminal of the corresponding complementary search bit $\overline{SB_j}$ and the output terminal of the comparison result $CR_{i,j}$. The static CMOS logic circuit 13 is a NAND gate with two input terminals and an output terminal.

Referring to FIG. 2(b), for each memory unit 2, the data memory cell 21 is a SRAM cell. The comparison circuit 22 includes two NMOS transistors 221, 223 and two PMOS transistors 222, 224. The NMOS transistor 221 and the PMOS transistor 222 are controlled by the complementary data bit $\overline{DB_{i,j}}$ and the data bit $DB_{i,j}$, respectively, and are connected in parallel between the input terminal of the corresponding search bit $SB_j$ and the output terminal of the complementary comparison result $\overline{CR_{i,j}}$. The NMOS transistor 223 and the PMOS transistor 224 are controlled by the data bit $DB_{i,j}$ and the complementary data bit $\overline{DB_{i,j}}$, respectively, and are connected in parallel between the input terminal of the corresponding complementary search bit $\overline{SB_j}$ and the output terminal of the complementary comparison result $\overline{CR_{i,j}}$. The static CMOS logic circuit 23 is a NOR gate with two input terminals and an output terminal.

The operating principles of this embodiment are detailed below. For each memory unit 1, when the data bit $DB_{i,j}$ and the complementary data bit $\overline{DB_{i,j}}$ stored in the data memory cell 11 match the corresponding search bit $SB_j$ and the corresponding complementary search bit $\overline{SB_j}$ (for example, ($DB_{i,j}$, $\overline{DB_{i,j}}$, $SB_j$, $\overline{SB_j}$) are (0, 1, 0, 1) or (1, 0, 1, 0)), the comparison result $CR_{i,j}$ output by the comparison circuit 12 is 1. In this case, if the matching result $MR_{i,j}$ output from the previous memory unit 2 is also 1, the complementary matching result $\overline{MR_{i,j-1}}$ output from the static CMOS logic circuit 13 is 0. This indicates that the memory unit 1 is matched with the previous memory units 1, 2.

Furthermore, for each memory unit 2, when the data bit $DB_{i,j}$ and the complementary data bit $\overline{DB_{i,j}}$ stored in the data memory cell 21 match the corresponding search bit $SB_j$ and the corresponding complementary search bit $\overline{SB_j}$ (for example, ($DB_{i,j}$, $\overline{DB_{i,j}}$, $SB_j$, $\overline{SB_j}$) are (0, 1, 0, 1) or (1, 0, 1, 0), the complementary comparison result $\overline{CR_{i,j}}$ output by the comparison circuit 22 is 0. In this case, if the complementary matching result $\overline{MR_{i,j-1}}$ output from the previous memory unit 1 is also 0, the matching result $MR_{i,j}$ output from the static CMOS logic circuit 23 is 1. This indicates that the memory unit 2 is matched with the previous memory units 1, 2.

Therefore, when the matching result $MR_{i,n}$, output by the last memory unit 2 of each row is 1 (that is, the matching bit $MB_i$ is 1), this indicates that the particular row is matched. Otherwise, a 0 value for the matching result $MR_{i,n}$, indicates that the particular row is not matched. Since this embodiment uses the static CMOS logic circuits 13, 23 for generating the matching bit $MB_i$, precharging is unnecessary with respect to the input terminal of the search bit $\overline{SB_j}$, the input terminal of the complementary search bit $\overline{SB_j}$, and the output terminal of the matching bit $MB_i$, and there is no static electric current. Hence, operating speed is increased and power consumption is minimized.

Second Preferred Embodiment

Figure 3:
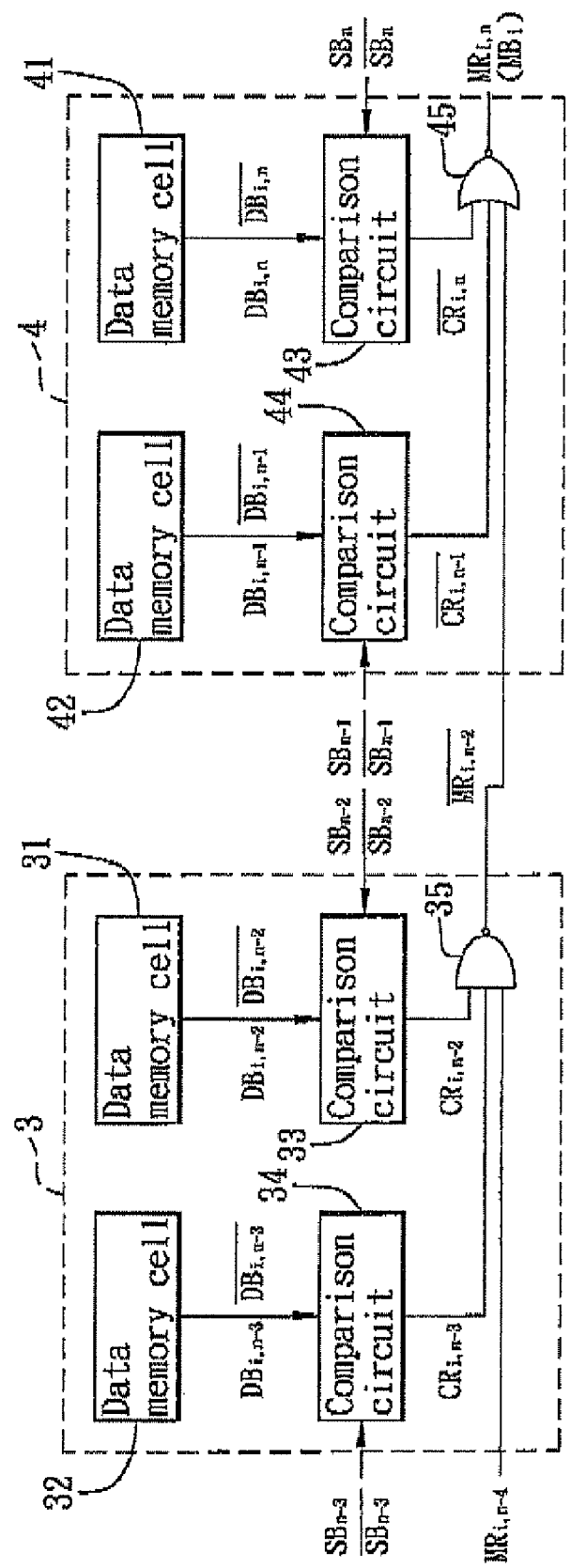
FIG. 3 is a simplified block diagram of the second preferred embodiment of a content-addressable memory according to the present invention.

Referring to FIG. 3, the second preferred embodiment of a CAM according to the present invention is a binary CAM, and includes a plurality of memory units 3 and a plurality of memory units 4 (in FIG. 3, only the last two memory units 3, 4 on an ith row are shown). For each row, the memory units 3 are alternatingly disposed with the memory units 4, and each memory unit 3, 4 receives two of the n-number of search bits $SB_j$ and two of the n-number of complementary search bits $\overline{SB_j}$.

Each memory unit 3 includes two data memory cells 31, 32, two comparison circuits 33, 34, and a static CMOS logic circuit 35. The data memory cell 31 stores a data bit $DB_{i,j}$ and a complementary data bit $\overline{DB_{i,j}}$. The data memory cell 32 stores a data bit $DB_{i,j-1}$ and a complementary data bit $\overline{DB_{i,j-1}}$. The comparison circuit 33 is coupled to the data memory cell 31, receives the corresponding search bit $SB_j$, the corresponding complementary search bit $\overline{SB_j}$, and the data bit $DB_{i,j}$ and complementary data bit $\overline{DB_{i,j}}$ stored in the data memory cell 31, compares the corresponding search bit $SB_j$ and the corresponding complementary search bit $\overline{SB_j}$ with the data bit $DB_{i,j}$ and complementary data bit $\overline{DB_{i,j}}$ stored in the data memory cell 31 to determine if there is a match, and outputs a comparison result $CR_{i,j}$. The comparison circuit 34 is coupled to the data memory cell 32, receives the corresponding search bit $SB_{j-1}$, the corresponding complementary search bit $\overline{SB_{j-1}}$, and the data bit $DB_{i,j-1}$ and the complementary data bit $\overline{DB_{i,j-1}}$ stored in the data memory cell 32, compares the corresponding search bit $SB_{j-1}$ and the corresponding complementary search bit $\overline{SB_{j-1}}$ with the data bit $DB_{i,j-1}$ and the complementary data bit $\overline{DB_{i,j-1}}$ stored in data memory cell 32 to determine if there is a match, and outputs a comparison result $CR_{i,j-1}$. The static CMOS logic circuit 35 is coupled to the comparison circuits 33, 34 and a previous memory unit 9, and receives the comparison results $CR_{i,j}$, $CR_{i,j-1}$ output from the comparison circuits 33, 34 and a matching result $MR_{i,j-2}$ output from the previous memory unit 4 so as to perform a logic operation thereon, and outputs a complementary matching result $\overline{MR_{i,j}}$ accordingly.

Each memory unit 4 includes two data memory cells 41, 42, two comparison circuits 43, 44, and a static CMOS logic circuit 45. The data memory cell 41 stores a data bit $DB_{i,j}$ and a complementary data bit $\overline{DB_{i,j}}$. The data memory cell 42 stores a data bit $DB_{i,j-1}$ and a complementary data bit $\overline{DB_{i,j-1}}$. The comparison circuit 43 is coupled to the data memory cell 41, receives the corresponding search bit $SB_j$, the corresponding complementary search bit $\overline{SB_j}$, and the data bit $DB_{i,j}$ and complementary data bit $\overline{DB_{i,j}}$ stored in the data memory cell 41, compares the corresponding search bit $SB_j$ and the corresponding complementary search bit $\overline{SB_j}$ with the data bit $DB_{i,j}$ and complementary data bit $\overline{DB_{i,j}}$ stored in the data memory cell 41 to determine if there is a match, and outputs a complementary comparison result $\overline{CR_{i,j}}$. The comparison circuit 44 is coupled to the data memory cell 42, receives the corresponding search bit $SB_{j-1}$, the corresponding complementary search bit $\overline{SB_{j-1}}$, and the data bit $DB_{i,j-1}$ and the complementary data bit $\overline{DB_{i,j-1}}$ stored in the data memory cell 42, compares the corresponding search bit $SB_{j-1}$ and the corresponding complementary search bit $\overline{SB_{j-1}}$ with the data bit $DB_{i,j-1}$ and complementary data bit $\overline{DB_{i,j-1}}$ stored in the data memory cell 42 to determine if there is a match, and outputs a complementary comparison result $\overline{CR_{i,j-1}}$. The static CMOS logic circuit 45 is coupled to the comparison circuits 43, 44 and a previous memory unit 3, and receives the complementary comparison results $\overline{CR_{i,j}}$, $\overline{CR_{i,j-1}}$ output from the comparison circuits 43, 44 and a complementary matching result $\overline{MR_{i,j-2}}$ output from the previous memory unit 3 so as to perform a logic operation thereon, and outputs a matching result $MR_{i,j}$ accordingly. The matching result $MR_{i,n}$ output from the last memory unit 4 of each row functions as the matching bit $MB_i$.

Figure 4:
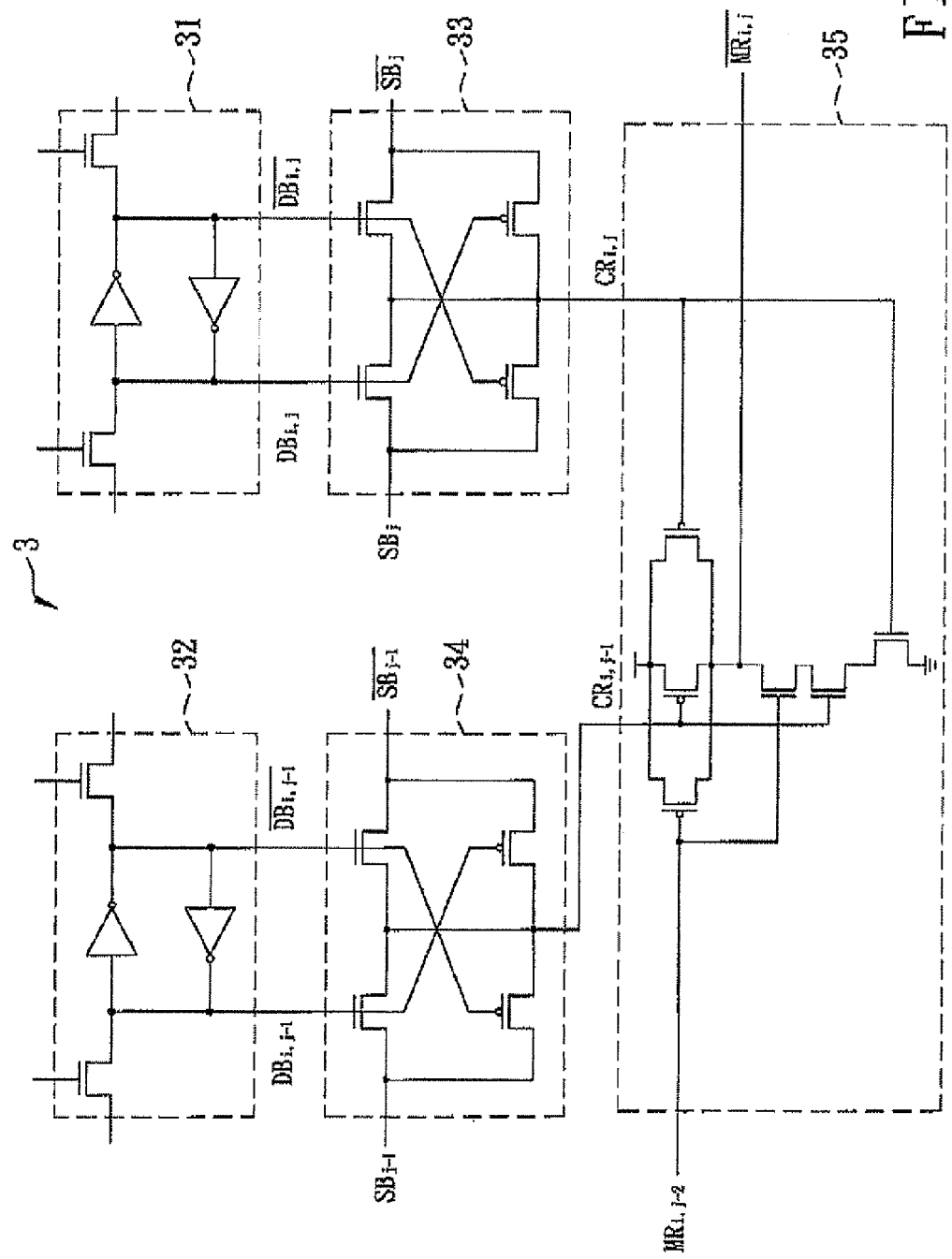
FIG. 4 is a schematic circuit diagram, illustrating a memory unit of the second preferred embodiment.
Figure 5:
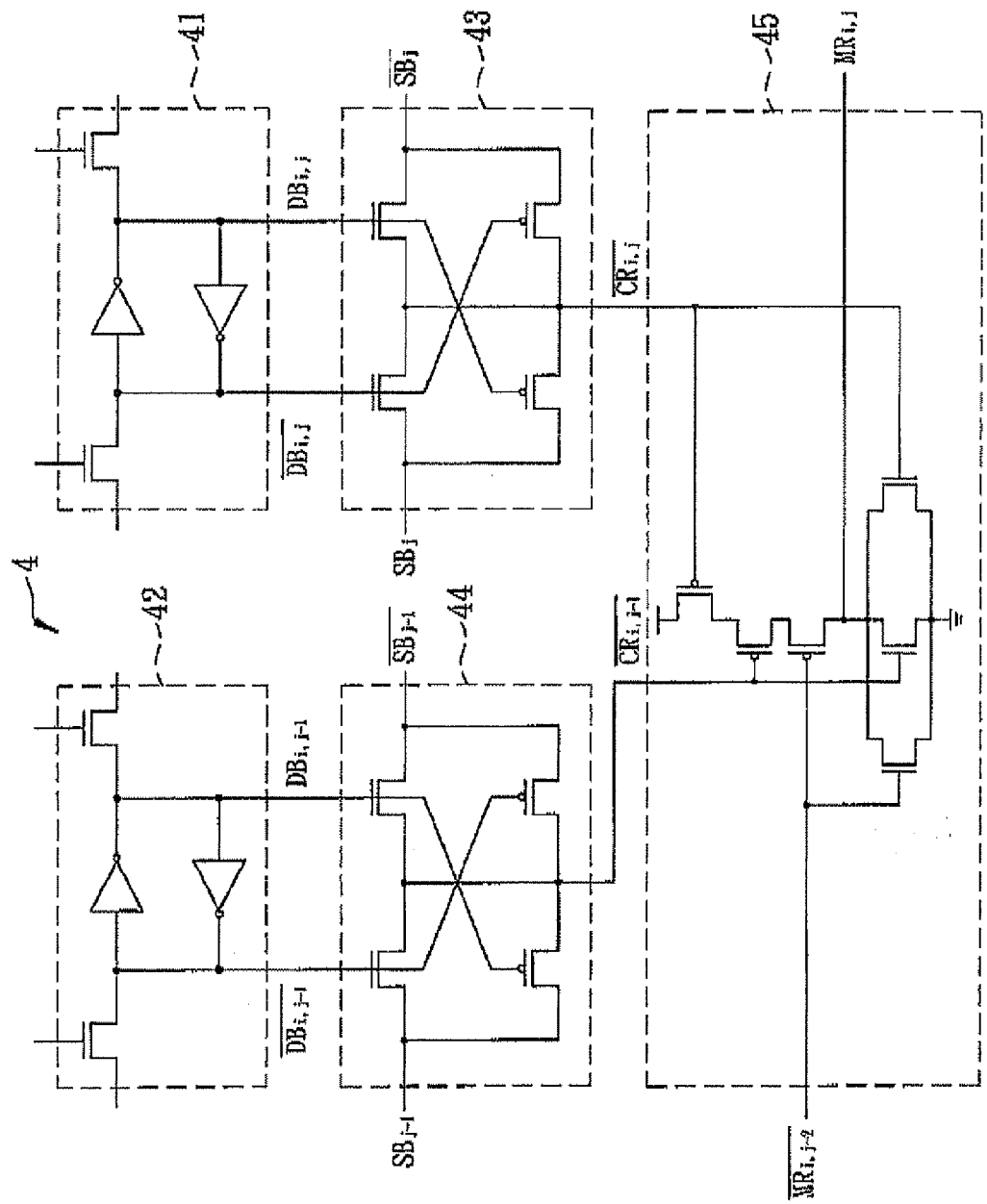
FIG. 5 is a schematic circuit diagram, illustrating another memory unit of the second preferred embodiment.

Referring to FIG. 4, for each memory unit 3, each data memory cell 31, 32 is identical to the data memory cell 11 of the first preferred embodiment, and so a further description of the same is not provided herein. Further, each comparison circuit 33, 34 is identical to the comparison circuit 12 of the first preferred embodiment, and so a further description of the same is not provided herein. The static CMOS logic circuit 35 is a NAND gate with three input terminals and an output terminal. Referring to FIG. 5, for each memory unit 4, each data memory cell 41, 42 is identical to the data memory cell 21 of the first preferred embodiment, and so a further description of the same is not provided herein. Each comparison circuit 43, 44 is identical to the comparison circuit 22 of the first preferred embodiment, and so a further description of the same is not provided herein. The static CMOS logic circuit 45 is a NOR gate with three input terminals and an output terminal.

The operating principles of this embodiment may be ascertained from the explanation of the operating principles of the first preferred embodiment provided above, and so a description of the same is not provided herein. Since this embodiment uses the static CMOS logic circuits 35, 45 to generate the matching bit $MB_i$, precharging is unnecessary with respect to the input terminal of the search bit $SB_j$, the input terminal of the complementary search bit $\overline{SB_j}$, and the output terminal of the matching bit $MB_i$, and there is no static electric current. Hence, operating speed is increased and power consumption is minimized.

It is to be noted that, in the first preferred embodiment, each memory unit 1, 2 includes one data memory cell 11, 21 and one comparison circuit 12, 22, and therefore, each memory unit 1, 2 includes one CAM, and generates a matching result or a complementary matching result through one static CMOS logic circuit 13, 23. In the second preferred embodiment, each memory unit 3, 4 includes two data memory cells 31, 32, 41, 42 and two comparison circuits 33, 34, 43, 44, and therefore, each memory unit 3, 4 includes two CAMs, and generates a matching result or a complementary matching result through one static CMOS logic circuit 35, 45. However, in other embodiments, each memory unit may include a larger number of CAMs, and generate a matching result or a complementary matching result through a static CMOS logic circuit.

Third Preferred Embodiment

Figure 6:
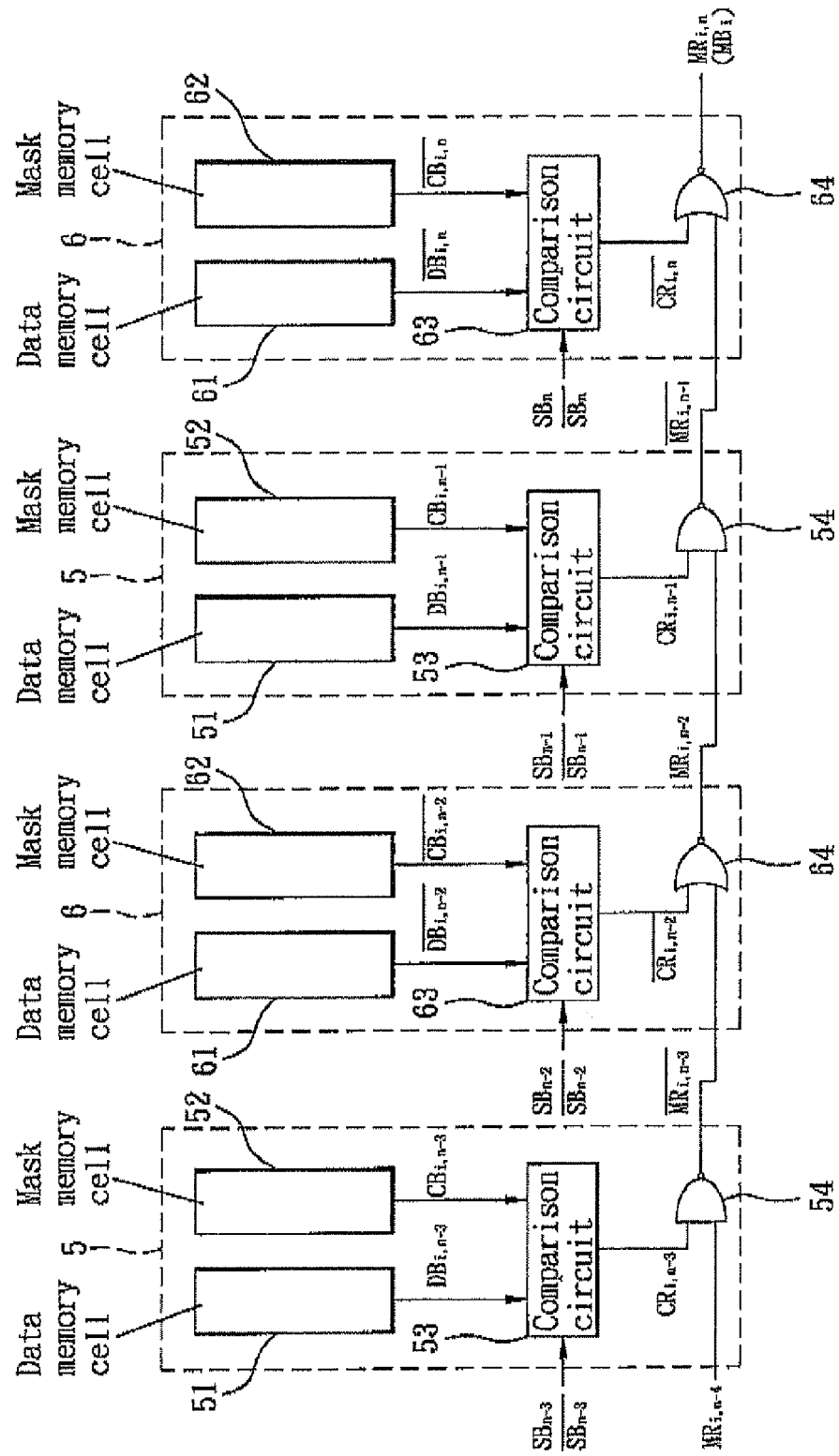
FIG. 6 is a simplified block diagram of the third preferred embodiment of a content-addressable memory according to the present invention.

Referring to FIG. 6, the third preferred embodiment of a CAM according to the present invention is a ternary CAM, and includes a plurality of memory units 5 and a plurality of memory units 6 (in FIG. 6, only the last four memory units 5, 6 on an ith row are shown). For each row, the memory units 5 are alternatingly disposed with the memory units 6, and each memory unit 5, 6 receives one of the n-number of search bits $SB_j$, and one of the n-number of complementary search bits $\overline{SB_j}$.

Each memory unit 5 includes a data memory cell 51, a mask memory cell 52, a comparison circuit 53, and a static CMOS logic circuit 54. The data memory cell 51 stores a data bit $DB_{i,j}$. The mask memory cell 52 stores a mask bit $CB_{i,j}$. The comparison circuit 53 is coupled to the data memory cell 51 and the mask memory cell 52, receives the corresponding search bit $SB_j$, the corresponding complementary search bit $\overline{SB_j}$, the data bit $DB_{i,j}$ stored in data memory cell 51, and the mask bit $CB_{i,j}$ stored in the mask memory cell 52, compares the corresponding search bit $SB_j$ and the corresponding complementary search bit $\overline{SB_j}$ with the data bit $DB_{i,j}$ stored in data memory cell 51 and the mask bit $CB_{i,j}$ stored in the mask memory cell 52 to determine if there is a match, and outputs a comparison result $CR_{i,j}$. The static CMOS logic circuit 54 is coupled to the comparison circuit 53 and a previous memory unit 6, receives the comparison result $CR_{i,j}$ output from the comparison circuit 53 and a matching result $MR_{i,j-1}$ output from the previous memory unit 6 so as to perform a logic operation thereon, and outputs a complementary matching result $\overline{MR_{i,j}}$ accordingly.

Each memory unit 6 includes a data memory cell 61, a mask memory cell 62, a comparison circuit 63, and a static CMOS logic circuit 64. The data memory cell 61 stores a complementary data bit $\overline{DB_{i,j}}$. The mask memory cell 62 stores a complementary mask bit $\overline{CB_{i,j}}$. The comparison circuit 63 is coupled to the data memory cell and the mask memory cell 62, receives the corresponding search bit $SB_j$, the corresponding complementary search bit $\overline{SB_j}$, the complementary data bit $\overline{DB_{i,j}}$ stored in the data memory cell 61, and the complementary mask bit $\overline{CB_{i,j}}$ stored in the mask memory cell 62, compares the corresponding search bit $SB_j$ and the corresponding complementary search bit $SB_j$ with the complementary data bit $\overline{DB_{i,j}}$ stored in the data memory cell 61 and the complementary mask bit $\overline{CB_{i,j}}$ stored in the mask memory cell 62 to determine if there is a match, and outputs a complementary comparison result $\overline{CR_{i,j}}$. The static CMOS logic circuit 64 is coupled to the comparison, circuit 63 and a previous memory unit 5, receives the complementary comparison result $\overline{CR_{i,j}}$ output from the comparison circuit 63 and a complementary matching result $\overline{MR_{i,j-1}}$ output from the previous memory unit 5 so as to perform a logic operation thereon, and outputs a matching result $MR_{i,j}$ accordingly. The matching result $MR_{i,n}$ output from the last memory unit 6 in each row functions as the matching bit $MB_i$.

The manner in which encoding is performed for each memory unit 5, 6 and the determination of whether there is a match are as shown in the table below.

| $DB_{i,j}/\overline{DB_{i,j}}$ | $CB_{i,j}/\overline{CB_{i,j}}$ | State | Matching state |
|---|---|---|---|
| 0/1 | 0/1 | Don't care | Definite match |
| 0/1 | 1/0 | 0 | Depends on $SB_j$ and $\overline{SB_j}$ |
| 1/0 | 0/1 | 1 | Depends on $SB_j$ and $\overline{SB_j}$ |
| 1/0 | 1/0 | Invalid | Definite non-match |

Figure 7:
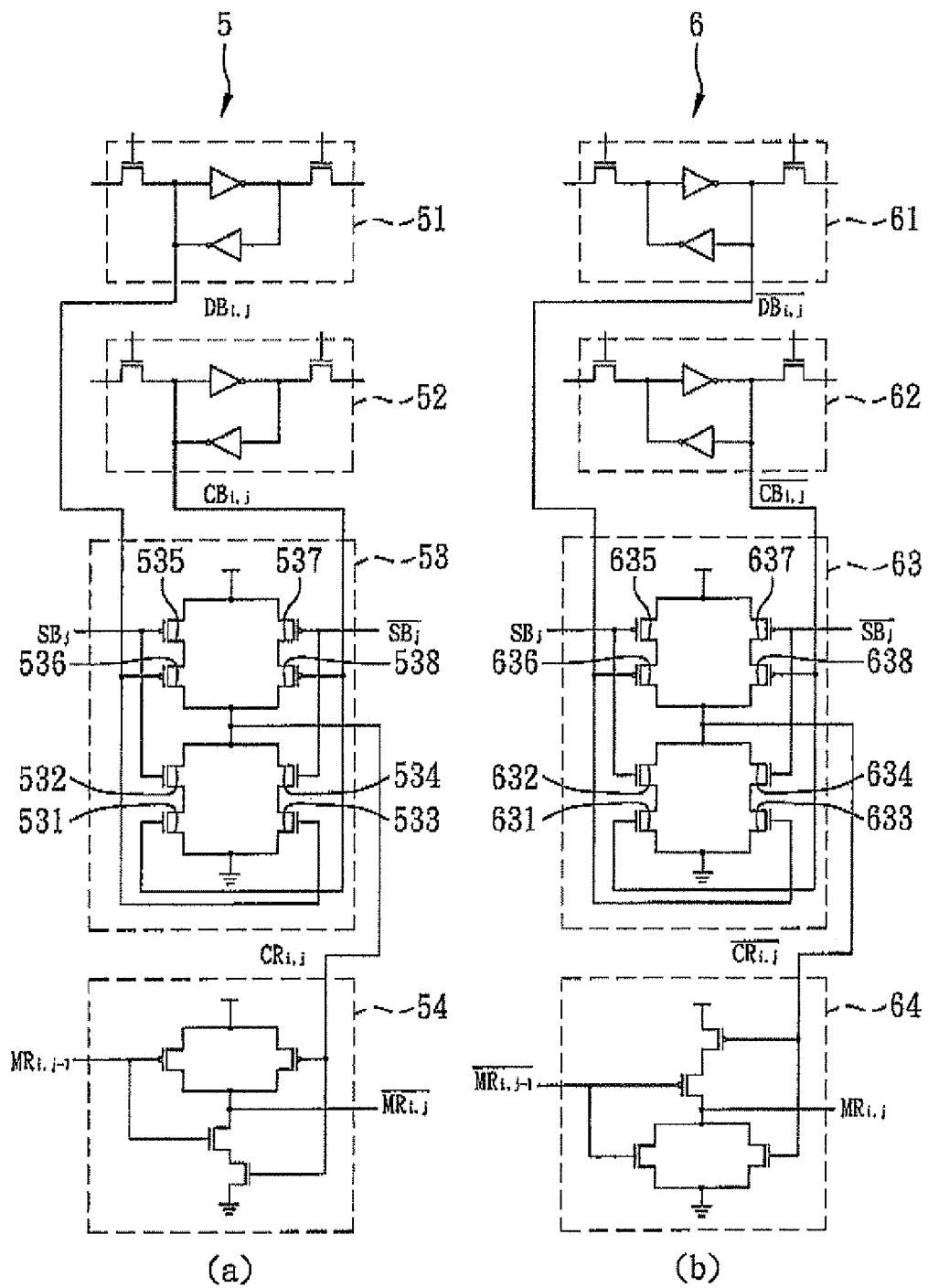
FIG. 7 is a schematic circuit diagram, illustrating memory units of the third preferred embodiment.

Referring to FIG. 7(a), for each memory unit 5, each of the data memory cell 51 and the mask memory cell 52 is a SRAM cell. The comparison circuit 53 includes four NMOS transistors 531~534 and four PMOS transistors 535~538. The NMOS transistors 531, 532 are controlled by the mask bit $CB_{i,j}$ and the corresponding search bit $SB_j$, respectively, and are connected in series between an input terminal of ground voltage and an output terminal of the comparison result $CR_{i,j}$. The NMOS transistors 533, 534 are controlled by the data bit $DB_{i,j}$ and the corresponding complementary search bit $\overline{SB_j}$, respectively, and are connected in series between the input terminal of ground voltage and the output terminal of the comparison result $CR_{i,j}$. The PMOS transistors 535, 536 are controlled by the corresponding search bit $SB_j$ and the data bit $DB_{i,j}$, respectively, and are connected in series between an input terminal of an operational voltage and the output terminal of the comparison result $CR_{i,j}$. The PMOS transistors 537, 538 are controlled by the corresponding complementary search bit $\overline{SB_j}$ and the mask bit $CB_{i,j}$, respectively, and are connected in series between the input terminal of the operational voltage and the output terminal of the comparison result $CR_{i,j}$. The static CMOS logic circuit 54 is a NAND gate with two input terminals and an output terminal.

Referring to FIG. 7(b), for each memory unit 6, each of the data memory cell 61 and the mask memory cell 62 is a SRAM cell. The comparison circuit 63 includes four NMOS transistors 631~634 and four PMOS transistors 635~638. The NMOS transistors 631, 632 are controlled by the complementary mask bit $\overline{CB_{i,j}}$ and the corresponding search bit $SB_j$, respectively, and are connected in series between an input terminal of ground voltage and en output terminal of the complementary comparison result $\overline{CR_{i,j}}$. The NMOS transistors 633, 634 are controlled by complementary data bit $\overline{DB_{i,j}}$ and the corresponding complementary search bit $\overline{SB_j}$, respectively, and are connected in series between the input terminal of ground voltage and the output terminal of the complementary comparison result $\overline{CR_{i,j}}$. The PMOS transistors 635, 636 are controlled by the corresponding search bit $SB_j$ and the complementary data bit $\overline{DB_{i,j}}$, respectively, and are connected in series between an input terminal of an operational voltage and the output terminal of the complementary comparison result $\overline{CR_{i,j}}$. The PMOS transistors 637, 638 are controlled by the corresponding complementary search bit $\overline{SB_j}$ and the complementary mask bit $\overline{CB_{i,j}}$, respectively, and are connected in series between the input terminal of the operational voltage and the output terminal of the complementary comparison result $\overline{CR_{i,j}}$. The static CMOS logic circuit 64 is a NOR gate with two input terminals and an output terminal.

The operating principles of this embodiment are detailed below. For each memory unit 5, when the data bit $DB_{i,j}$ stored in the data memory cell 51 and the mask bit $CB_{i,j}$ stored in the mask memory cell 52 match the corresponding search bit $SB_j$ and the corresponding complementary search bit $\overline{SB_j}$ (for example, ($DB_{i,j}$, $CB_{i,j}$, $SB_j$, $\overline{SB_j}$) are (0, 1, 0, 1), (1, 0, 1, 0), (0, 0, 0, 1) or (0, 0, 1, 0)), the comparison result $CR_{i,j}$ output from the comparison circuit 53 is 1. If the matching, result $MR_{i,j-1}$ output from a previous memory unit 6 is 1, the complementary matching result $\overline{MR_{i,j}}$ output from the static CMOS logic circuit 54 is 0. This indicates that the memory unit 5 is matched with the previous memory units 5, 6.

For each memory unit 6, when the complementary data it $\overline{DB_{i,j}}$ stored in the data memory cell 61 and the complementary mask bit $\overline{CB_{i,j}}$ stored in the mask memory cell 62 match the corresponding search bit $SB_j$, and the corresponding complementary search bit $\overline{SB_j}$ (for example, ($\overline{DB_{i,j}}$, $\overline{CB_{i,j}}$, $SB_j$, $\overline{SB_j}$) are (1, 0, 0, 1), (0, 1, 1, 0), (1, 2, 0, 1) or (1, 1, 1, 0)), the complementary comparison result $\overline{CR_{i,j}}$ output from the comparison circuit 63 is 0. If the complementary matching result $\overline{MR_{i,j-1}}$ output from the a previous memory unit 5 is 0, the matching result $MR_{i,j}$ output from the static CMOS logic circuit 64 is 1. This indicates that the memory unit 6 is matched with the previous memory units 5, 6.

Therefore, when the matching result $MR_{i,n}$ output by the last memory unit 6 of each row is 1(that is, the matching bit $MB_i$ is this indicates that the particular row is matched. Otherwise, a 0 value for the matching result $MR_{i,n}$ indicates that the particular row is not matched. Since this embodiment uses the static CMOS logic circuits 54, 64 for generating matching bit $MB_i$, precharging is unnecessary with respect to the input terminal of the search bit $SB_j$, the input terminal of the complementary search bit $\overline{SB_j}$, and the output terminal of the matching bit $MB_i$, and there is no static electric current. Hence, operating speed is increased and power consumption is minimized.

Fourth Preferred Embodiment

Figure 8:
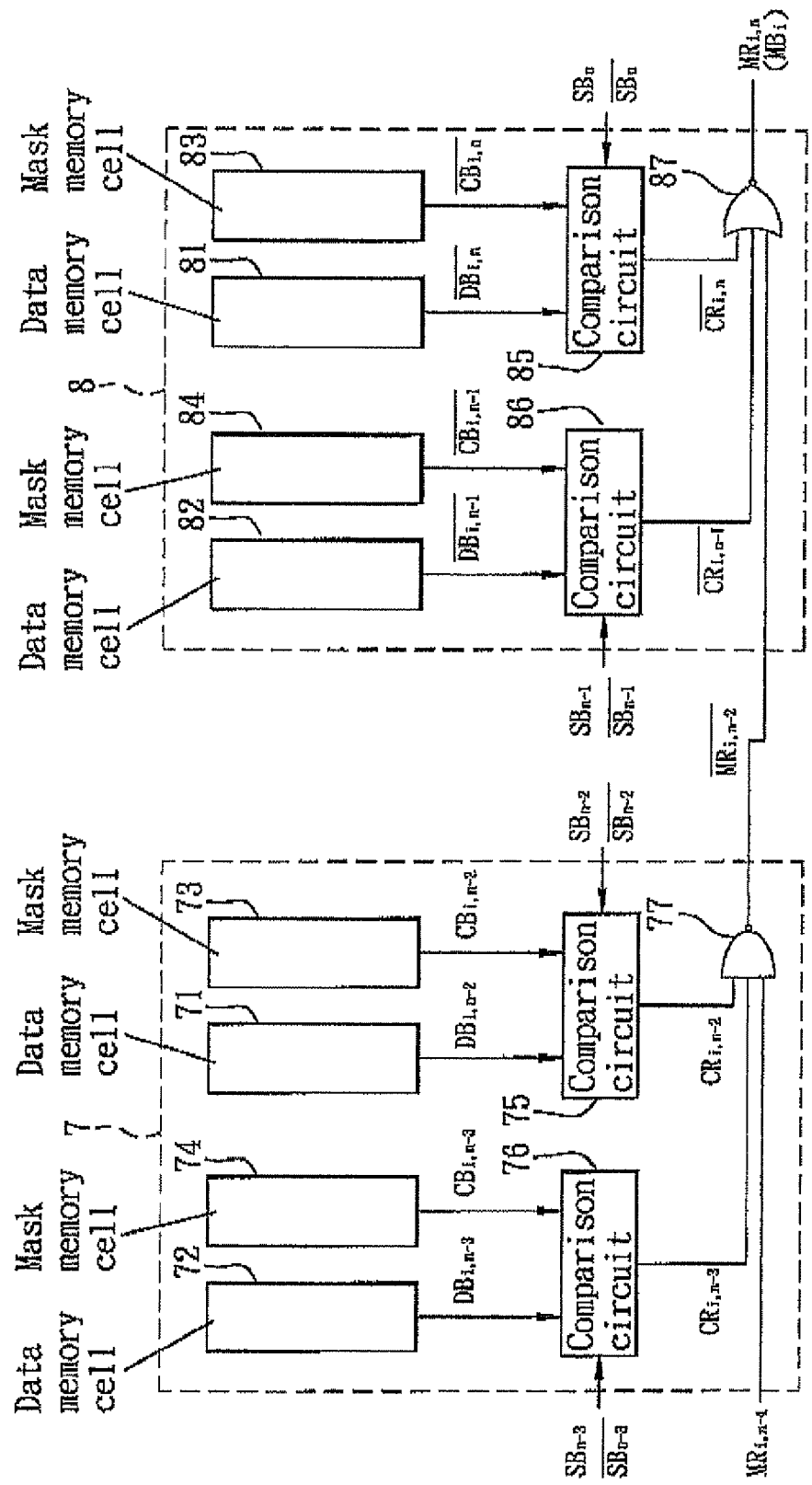
FIG. 8 is a simplified block diagram of the fourth preferred embodiment of a content-addressable memory according to the present invention.

Referring to FIG. 8, the fourth preferred embodiment of a CAM according to the present invention is a ternary CAM, and includes a plurality of memory units 7 and a plurality of memory units 8 (in FIG. 8, only the last two memory units 7, 8 on an ith row are shown). For each row, the memory units 7 are alternatingly disposed with the memory units 8, and each memory unit 7, 8 receives two of the n-number of search bits $SB_j$ and two of the n-number of complementary search bits $\overline{SB_j}$.

Each memory unit 7 includes two data memory cells 71, 72, two mask memory cells 73, 74, two comparison circuits 75, 76, and a static CMOS logic circuit 77. The data memory cell 71 stores a data bit $DB_{i,j}$. The data memory cell 72 stores a data bit $DB_{i,j-1}$. The mask memory cell 73 stores a mask bit $CB_{i,j}$. The mask memory cell 74 stores a mask bit $CB_{i,j-1}$. The comparison circuit 75 is coupled to the data memory cell 71 and the mask memory cell 73, receives the corresponding search bit $SB_j$, the corresponding complementary search bit $\overline{SB_j}$, the data bit $DB_{i,j}$ stored in the data memory cell 71, and the mask bit $CB_{i,j}$ stored in the mask memory cell 73, compares the corresponding search bit $SB_j$ and the corresponding complementary search bit $\overline{SB_j}$ with the data bit $DB_{i,j}$ stored in the data memory cell 71 and the mask bit $CB_{i,j}$ stored in the mask memory cell 73 to determine if there is a match, and outputs a comparison result $CR_{i,j}$. The comparison circuit 76 is coupled to the data memory cell and the mask memory cell 74, receives the corresponding search bit $SB_{j-1}$, the corresponding complementary search bit $\overline{SB_{j-1}}$, the data bit $DB_{i,j-1}$ stored in the data memory cell 72 and the mask bit $CB_{i,j-1}$ stored in the mask memory cell 74, compares the corresponding search bit $SB_{j-1}$ and the corresponding complementary search bit $\overline{SB_{j-1}}$ with the data bit $DB_{i,j-1}$ stored in the data memory cell 72 and the mask bit $CB_{i,j-1}$ stored in the mask memory cell 74 to determine it there is a match, and outputs a comparison result $CR_{i,j-1}$. The static CMOS logic circuit 77 is coupled to the comparison circuits 75, 76 and a previous memory unit 8, receives the comparison results $CR_{i,j}$, $CR_{i,j-1}$ output from the comparison circuits 75, 76 and a matching result $MR_{i,j-2}$ output from the previous memory unit 8 so as to perform a logic operation thereon, and outputs a complementary matching result $\overline{MR_{i,j}}$ accordingly.

Each memory unit 8 includes two data memory cells 81, 82, two mask memory cells 83, 84, two comparison circuits 85, 86, and a static CMOS logic circuit 87. The data memory cell 81 stores a complementary data bit $\overline{DB_{i,j}}$. The data memory cell 82 stores a complementary data bit $\overline{DB_{i,j-1}}$. The mask memory cell 83 stores a complementary mask bit $\overline{CB_{i,j}}$. The mask memory cell 84 stores a complementary mask bit $\overline{CB_{i,j-1}}$. The comparison circuit 85 is coupled to the data memory cell 81 and the mask memory cell 83, receives the corresponding search bit $SB_j$, the corresponding complementary search bit $\overline{SB_j}$, the complementary data bit $\overline{DB_{i,j}}$ stored in the data memory cell 81, and the complementary mask bit $\overline{CB_{i,j}}$ stored in the mask memory cell 83, compares the corresponding search bit $SB_j$ and the corresponding complementary search bit $\overline{SB_j}$ with the complementary data bit $\overline{DB_{i,j}}$ stored in the data memory cell 81 and the complementary mask bit $\overline{CB_{i,j}}$ stored in the mask memory cell 83 to determine if there is a match, and outputs a complementary comparison result $\overline{CR_{i,j}}$. The comparison circuit 86 is coupled to the data memory cell 82 and the mask memory cell 84, receives the corresponding search bit $SB_{j-1}$, the corresponding complementary search bit $\overline{SB_{j-1}}$, the complementary data bit $\overline{DB_{i,j-1}}$ stored in the data memory cell 82, and the complementary mask bit $\overline{CB_{i,j-1}}$ stored in the mask memory cell 84, compares the corresponding search bit $SB_{j-1}$ and the corresponding complementary search bit $\overline{SB_{j-1}}$ with the complementary data bit $\overline{DB_{i,j-1}}$, stored in the data memory cell 82 and the complementary mask bit $\overline{CB_{i,j-1}}$ stored in the mask memory cell 84 to determine if there is a match, and outputs a complementary comparison result $\overline{CR_{i,j-1}}$. The static CMOS logic circuit 87 is coupled to the comparison circuits 85, 86 and a previous memory unit 7, and receives the complementary comparison results $\overline{CR_{i,j}}$, $\overline{CR_{i,j-1}}$ output from the comparison circuits 85, 86 and the complementary matching result $\overline{MR_{i,j-2}}$ output from the previous memory unit 7 so as to perform a logic operation thereon, and outputs the matching result $MR_{i,j}$ accordingly. The matching result $MR_{i,n}$ output from the last memory unit 8 in each row functions as the matching bit $MB_i$.

Figure 9:
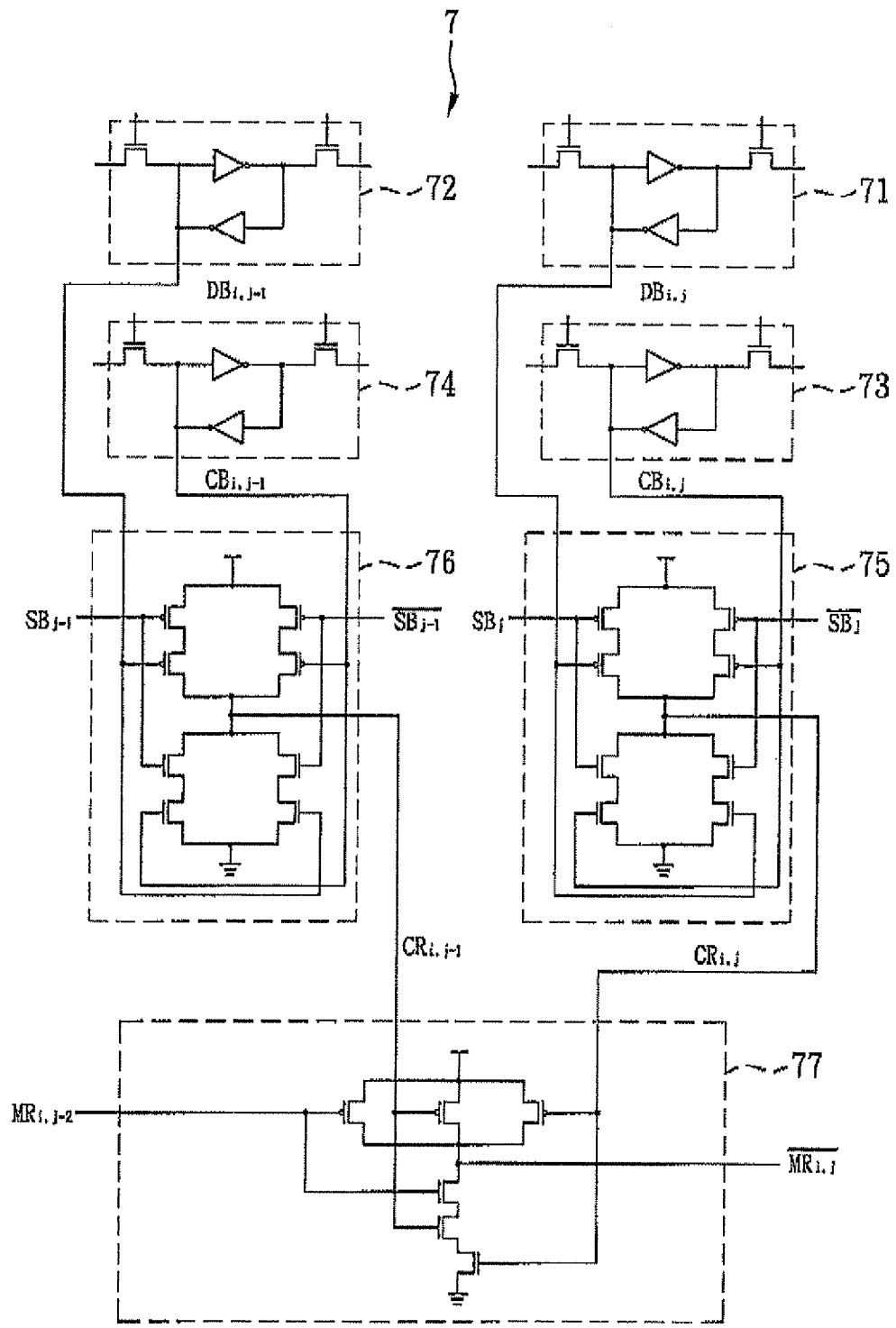
FIG. 9 is a schematic circuit diagram, illustrating a memory unit of the fourth preferred embodiment.
Figure 10:
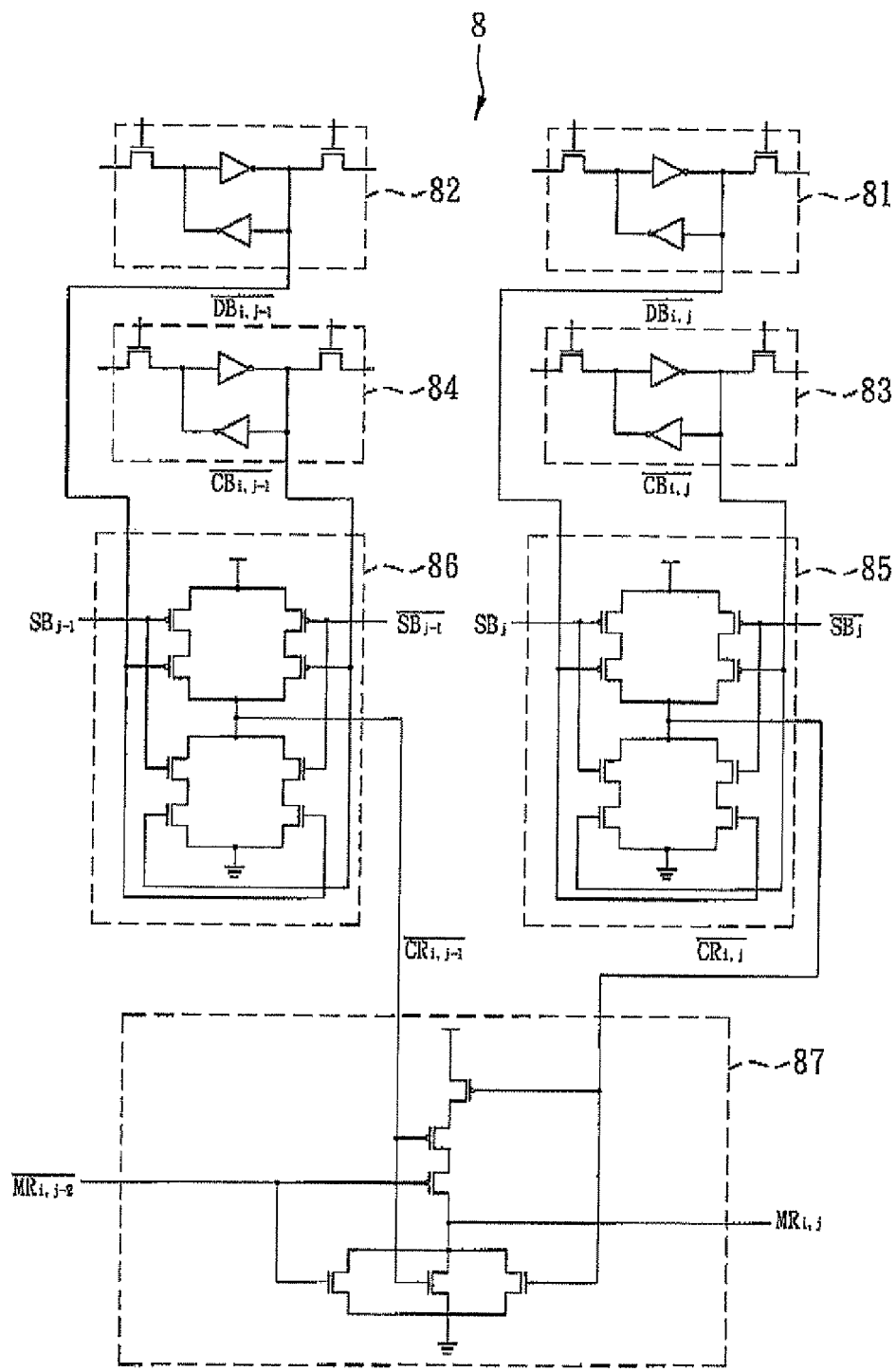
FIG. 10 is a schematic circuit diagram, illustrating another memory unit of the fourth preferred embodiment.

Referring to FIG. 9, for each memory unit 7, each data memory cell 71, 72 is identical to the data memory cell 51 of the third preferred embodiment, and so a further description of the same is not provided herein. Each mask memory cell 73, 74 is identical to the mask memory cell 52 of the third preferred embodiment, and so a further description of the same is not provided herein. Further, each comparison circuit 75, 76 is identical to the comparison circuit 53 of the third preferred embodiment, and so a further description of the same is not provided herein. The static CMOS logic circuit 77 is a NAND gate with three input terminals and an output terminal. Referring to FIG. 10, for each memory unit 8, each data memory cell 81, 82 is identical to the data memory cell 61 of the third preferred embodiment, and so a further description of the same is not provided herein. Each mask memory cell 83, 84 is identical to the mask memory cell 62 of the third preferred embodiment, and so a further description of the same is not provided herein. Each comparison circuit 85, 86 is identical to the comparison circuit 63 of the third preferred embodiment, and so a further description of the same is not provided herein. The static CMOS logic circuit 87 is a NOR gate with three input terminals and an output terminal.

The operating principles of this embodiment may be ascertained from the explanation of the operating principles of the third preferred embodiment, and so a description of the same is not provided herein. Since this embodiment uses the static CMOS logic circuits 77, 87 to generate the matching bit $MB_i$, precharging is unnecessary with respect to the input terminal of the corresponding search bit $SB_j$, the input terminal of the corresponding complementary search bit $\overline{SB_j}$, and the output terminal of the matching bit $MB_i$, and there is no static electric current. Hence, operating speed is increased and power consumption is minimized.

It is to be noted that, in the third preferred embodiment, each memory unit 5, 6 includes one data memory cell 51, 61, one mask memory cell 52, 62, and one comparison circuit 53, 63, and therefore, each memory unit 5, 6 includes one CAM, and generates a matching result or a complementary matching result through one static CMOS logic circuit 54, 64. In the fourth preferred embodiment, each memory unit 7, 8 includes two data memory cells 71, 72, 81, 82, two mask memory cells 73, 74, 83, 84, and two comparison circuits 75, 76, 85, 86, and therefore, each memory unit 7, 8 includes two CAMs, and generates a matching result or a complementary matching result through one static CMOS logic circuit 77, 87. However, in other embodiments, each memory unit may include a larger number of CAMs, and generate a matching result or a complementary matching result through a static CMOS logic circuit.

Fifth Preferred Embodiment

Figure 11:
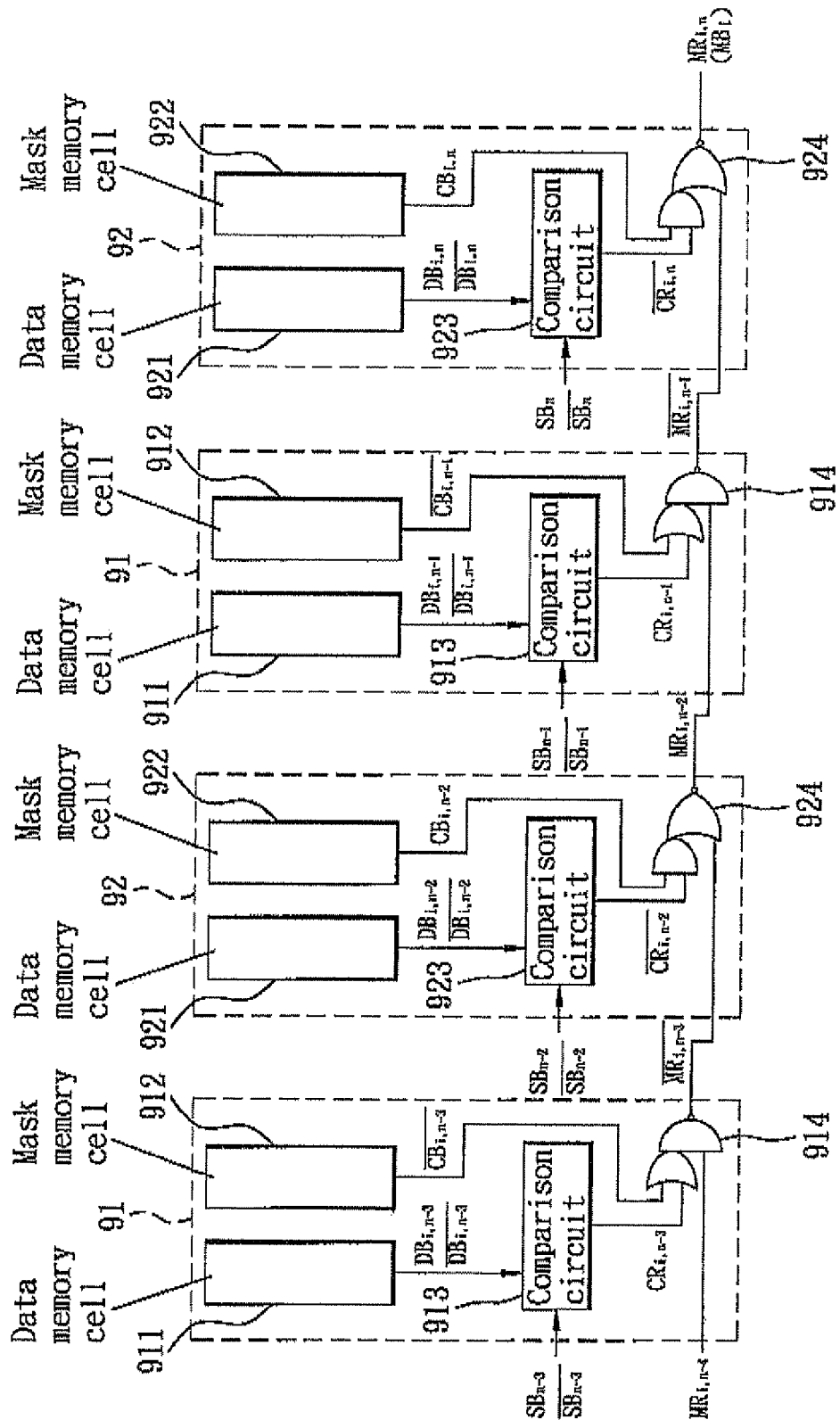
FIG. 11 is a simplified block diagram of the fifth preferred embodiment of a content-addressable memory according to the present invention.

Referring to FIG. 11, the fifth preferred embodiment of a CAM according to the present invention is a ternary CAM, and includes a plurality of memory units 91 and a plurality of memory units 92 (in FIG. 11, only the last four memory units 91, 92 on an ith row are shown). For each row, the memory units 91 are alternatingly disposed with the memory units 92, and each memory unit 91, 92 receives one of the n-number of search bits $SB_j$ and one of the n-number of complementary search bits $\overline{SB_j}$.

Each memory unit 91 includes a data memory cell 911, a mask memory cell 912, a comparison circuit 913, and a static CMOS logic circuit 914. The data memory cell 911 stores a data bit $DB_{i,j}$ and a complementary data bit $\overline{DB_{i,j}}$. The mask memory cell 912 stores a complementary mask bit $\overline{CB_{i,j}}$. The comparison circuit 913 is coupled to the data memory cell 911, receives the corresponding search bit $SB_j$, the corresponding complementary search bit $\overline{SB_j}$, and the data bit $DB_{i,j}$ and the complementary data bit $\overline{DB_{i,j}}$ stored in the data memory cell 911, compares the corresponding search bit $SB_j$ and the corresponding complementary search bit $\overline{SB_j}$ with the data bit $DB_{i,j}$ and complementary data bit $\overline{DB_{i,j}}$ stored in the data memory cell 911 to determine if there is a match, and outputs a comparison result $CR_{i,j}$. The static CMOS logic circuit 914 is coupled to the mask memory cell 912, the comparison circuit 913, and a previous memory unit 92, receives the complementary mask bit $\overline{CB_{i,j}}$ stored in the mask memory cell 912, the comparison result $CR_{i,j}$ output from the comparison circuit 913, and a matching result $MR_{i,j-1}$ output from the previous memory unit 92 so as to perform a logic operation thereon, and outputs a complementary matching result $\overline{MR_{i,j}}$ accordingly.

Each memory unit 92 includes a data memory cell 921, a mask memory cell 922, a comparison circuit 923, and a static CMOS logic circuit 924. The data memory cell 921 stores a data bit $DB_{i,j}$ and a complementary data bit $\overline{DB_{i,j}}$. The mask memory cell 922 stores a mask bit $CB_{i,j}$. The comparison circuit 923 is coupled to the data memory cell 921, receives the corresponding search bit $SB_j$, the corresponding complementary search bit $\overline{SB_j}$, and the data bit $DB_{i,j}$ and complementary data bit $\overline{DB_{i,j}}$, stored in the data memory cell 921, compares the Corresponding search bit $SB_j$ and the corresponding complementary search bit $\overline{SB_j}$ with the data bit $DB_{i,j}$ and the complementary data bit $\overline{DB_{i,j}}$ stored in the data memory cell 921 to determine if there is a match, and outputs a complementary comparison result $\overline{CR_{i,j}}$. The static CMOS logic circuit 924 is coupled to the mask memory cell 922, the comparison circuit 923, and a previous memory unit 91, receives the mask bit $CB_{i,j}$ stored in the mask memory cell 922, the complementary comparison result $\overline{CR_{i,j}}$ output from the comparison circuit 923, and the complementary matching result $\overline{MR_{i,j-1}}$ output from the previous memory unit 91 so as to perform a logic operation thereon, and outputs a matching result $MR_{i,j}$ accordingly. The matching result $MR_{i,n}$ output from the last memory unit 92 in each row functions as the matching bit $MB_i$.

The manner in which encoding is performed for each memory unit 91, 92 and the determination of whether there is a match are as shown in the table below.

| $DB_{i,j}/\overline{DB_{i,j}}$ | $CB_{i,j}/\overline{CB_{i,j}}$ | State | Matching state |
|---|---|---|---|
| 0/1 | 0/1 | Don't care | Definite match |
| 0/1 | 1/0 | 0 | Depends on $SB_j$ and $\overline{SB_j}$ |
| 1/0 | 0/1 | Don't care | Definite match |
| 1/0 | 1/0 | 1 | Depends on $SB_j$ and $\overline{SB_j}$ |

Figure 12:
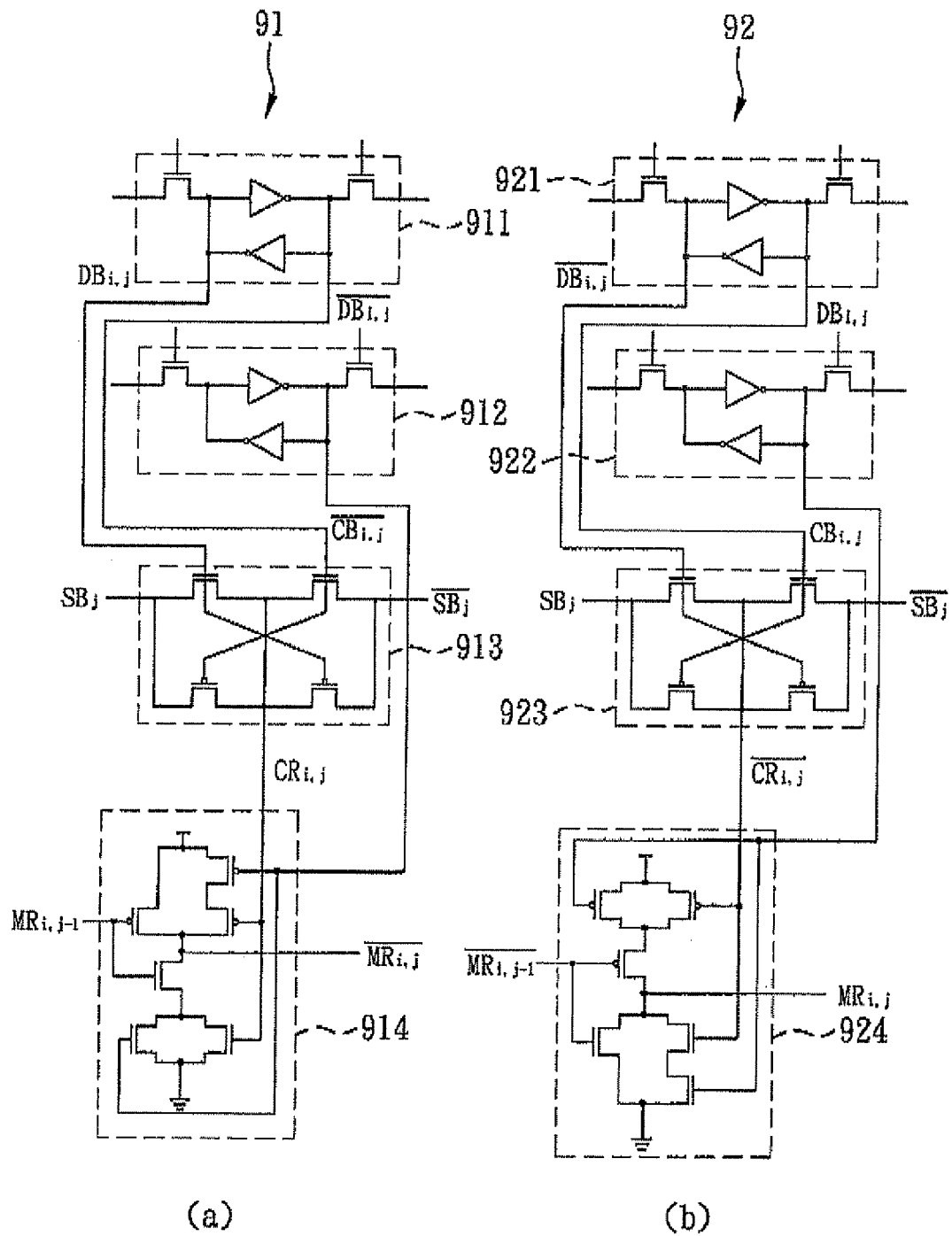
FIG. 12 is a schematic circuit diagram, illustrating memory units of the fifth preferred embodiment.

Referring to FIG. 12(a), for each memory unit 91, each of the data memory cell 911 and the mask memory cell 912 is a SRAM cell. The comparison circuit 913 is identical to the comparison circuit 12 of the first preferred embodiment, and so a further description of the same is not provided herein. The static CMOS logic circuit 914 is an OR-AND-Invert gate (OAI gate) with three input terminals and an output terminal. An OR operation is first performed with the complementary mask bit $\overline{CB_{i,j}}$ stored in the mask memory cell 912 and the comparison result $CR_{i,j}$ output from the comparison circuit 913, and then an AND operation is performed with the result of the OR operation and the matching result $MR_{i,j-1}$ output from the previous memory unit 92. The result of the AND operation is then inverted to thereby generate the complementary matching result $\overline{MR_{i,j}}$. Referring to FIG. 12(b), for each memory unit 92, each of the data memory cell 921 and the mask memory cell 922 is a SRAM cell. The comparison circuit 923 is identical to the comparison circuit 22 of the first preferred embodiment, and so a further description of the same is not provided herein. The static CMOS logic circuit 924 is an AND-OR-Inverse gate (AOI gate) with three input terminals and an output terminal. An AND operation is first performed with the mask bit $CB_{i,j}$ stored in the mask memory cell 922 and the complementary comparison result $\overline{CR_{i,j}}$ output from the comparison circuit 923, and then an OR operation is performed with the result of the AND operation and the complementary matching result $\overline{MR_{i,j-1}}$ output from the previous memory unit 91. The result of the OR operation is then inverted to thereby generate the matching result $MR_{i,j}$.

The operating principles of this embodiment are detailed below. For each memory unit 91, when the comparison result $CR_{i,j}$ output from the comparison circuit 913 is 1 or the complementary mask bit $\overline{CB_{i,j}}$ stored in the mask memory cell 912 is 1, if the matching result $MR_{i,j-1}$ output from the previous memory unit 6 is 1, the complementary matching result $\overline{MR_{i,j}}$ output from the static CMOS logic circuit 914 is 0, indicating that the memory unit 91 is matched with the previous memory units 91, 92.

Furthermore, for each memory unit 92, when the complementary the comparison result $\overline{CR_{i,j}}$ output from the comparison circuit 923 is 0 or the mask bit $CB_{i,j}$ stored in the mask memory cell 922 is 0, if the complementary matching result $\overline{MR_{i,j-1}}$ output from the previous memory unit 5 is 0, the matching result $MR_{i,j}$ output from the static CMOS logic circuit 924 is 1, indicating that the memory unit 92 is matched with the previous memory units 91, 92.

Therefore, when the matching result $MR_{i,n}$ output from the last memory unit 92 of each row is 1 (that is, the matching bit $MB_i$ is 1), this indicates that the particular row is matched. Otherwise, a 0 value for the matching result $MR_{i,n}$ indicates that the particular row is not matched. Since this embodiment uses the static CMOS logic circuits 914, 924 for generating matching bit $MB_i$, precharging is unnecessary with respect to the input terminal of the corresponding search bit $SB_j$, the input terminal of the corresponding complementary search bit $\overline{SB_j}$, and the output terminal of the matching bit $MB_i$, and there is no static electric current. Hence, operating speed is increased and power consumption is minimized.

It is to be noted that, in the aforementioned embodiments, each of the data memory cells 11, 21, 31, 32, 41, 42, 51, 61, 71, 72, 8, 82, 911, 921 and each of the mask memory cells 52, 62, 73, 74, 83, 84, 912, 922 is a SRAM. However, in other embodiments, other types of memory cells may be used. Moreover, the static CMOS logic circuits 13, 23, 35, 45, 54, 64, 77, 87, 914, 924 are not limited to the embodiments disclosed herein, and other designs may be employed for the static CMOS logic circuits 13, 23, 35, 45, 54, 64, 77, 87, 914, 924 as needed.

With the invention thus explained, it is apparent that various modifications and variations can be made without departing from the spirit of the present invention. It is therefore intended that the invention be limited only as recited in the appended claims.

What is claimed is:

1. A content-addressable memory (CAM) comprising:
a first memory unit including
a first data memory cell for storing a first data bit,
a first comparison circuit coupled to said first data memory cell, and for comparing a first search bit with the first data hit to determine if there is a match, and outputting a first comparison result, and
a first static complementary metal-oxide-semiconductor (CMOS) logic circuit coupled to said first comparison circuit, and for performing a logic operation on the first comparison result and outputting a first matching result; and
a second memory unit including
a second data memory cell for storing a second data bit,
a second comparison circuit coupled to said second data memory cell, and for comparing a second search bit with the second data bit to determine if there is a match, and outputting a second comparison result, and
a second static CMOS logic circuit coupled to said first static CMOS logic circuit and said second comparison circuit, and for performing a logic operation on the first matching result and the second comparison result, and outputting an output matching result, wherein said first static CMOS logic circuit and said second static CMOS logic circuit are different types of logic circuits.

2. The CAM as claimed in claim 1, wherein said first static CMOS logic circuit is a NAND gate and said second static CMOS logic circuit is a NOR gate.

3. The CAM as claimed in claim 1, wherein said first memory unit further includes:
a third data memory cell for storing a third data bit; and
a third comparison circuit coupled to said third data memory cell, and for comparing a third search bit with the third data bit to determine if there is a match, and outputting a third comparison result;
wherein said first static CMOS logic circuit is further coupled to said third comparison circuit, and performs a logic operation on the first comparison result and the third comparison result, and outputs the first matching result.

4. The CAM as claimed in claim 3, wherein said second memory unit further includes:
a fourth data memory cell for storing a fourth data bit; and
a fourth comparison circuit coupled to said fourth data memory cell, and for comparing a fourth search bit with the fourth data bit to determine if there is a match, and outputting a fourth comparison result;
wherein said second static CMOS logic circuit is further coupled to said fourth comparison circuit and performs a logic operation on the second comparison result, the fourth comparison result, and the first comparison result, and outputs the output matching result.

5. The CAM as claimed in claim 4, wherein said first static CMOS logic circuit is a NAND gate and said second static CMOS logic circuit is a NOR gate.

6. The CAM as claimed in claim 1, wherein said first memory unit further includes:
a first mask memory cell for storing a first mask bit;
wherein said first comparison circuit is further coupled to said first mask memory cell, and compares the first search bit, the first data bit, and the first mask bit to determine if there is a match, and outputs the first comparison result.

7. The CAM as claimed in claim 6, wherein said second memory unit further includes:
a second mask memory cell for storing a second mask bit;
wherein said second comparison circuit is further coupled to said second mask memory cell, and compares the second search bit, the second data bit, and the second mask bit to determine if there is a match, and outputs the second comparison result.

8. The CAM as claimed in claim 7, wherein said first static CMOS logic circuit is a NAND gate and said second static CMOS logic circuit is a NOR gate.

9. The CAM as claimed in claim 7, wherein said first memory unit further includes:
a third data memory cell for storing a third data bit;
a third mask memory cell for storing a third mask bit; and
a third comparison circuit coupled to said third data memory cell and said third mask memory cell, and for comparing a third search bit, the third data bit, and the third mask bit to determine if there is a match, and outputting a third comparison result;
wherein said first static CMOS logic circuit is further coupled to said third comparison circuit, and performs a logic operation on the first comparison result and the third comparison result, and outputs the first matching result.

10. The CAM as claimed in claim 9, wherein said second memory unit further includes:
a fourth data memory cell for storing a fourth data bit;
a fourth mask memory cell for storing a fourth mask bit; and
a fourth comparison circuit coupled to said fourth data memory cell and said fourth mask memory cell, and for comparing a fourth search bit, the fourth data bit, and the fourth mask bit to determine if there is a match, and outputting a fourth comparison result;
wherein said second static CMOS logic circuit is further coupled to said fourth comparison circuit, and performs a logic operation on the second comparison result, the fourth comparison result, and the first matching result, and outputs the output matching result.

11. The CAM as claimed in claim 10, wherein said first static CMOS logic circuit is a NAND gate and said second static CMOS logic circuit is a NOR gate.

12. The CAM as claimed in claim 1, wherein said first memory unit further includes:
a first mask memory cell for storing a first mask bit;
wherein said first static CMOS logic circuit is further coupled to said first mask memory cell, and performs a logic operation on the first comparison result and the first mask bit, and outputs the first matching result.

13. The CAM as claimed in claim 12, wherein said second memory unit further includes:
a second mask memory cell for storing a second mask bit;
wherein said second static CMOS logic circuit is further coupled to said second mask memory cell, and performs a logic operation on the second comparison result, the second mask bit, and the first matching result, and outputs the output matching result.

14. The CAM as claimed in claim 13, wherein said first static CMOS logic circuit is an OR-AND-Inverse (OAI) gate and said second static CMOS logic circuit is an AND-OR-Inverse (AOI) gate.

* * * * *